(12) United States Patent
Akagawa et al.

(10) Patent No.: US 6,255,725 B1
(45) Date of Patent: Jul. 3, 2001

(54) IC CARD AND PLANE COIL FOR IC CARD

(75) Inventors: Masatoshi Akagawa; Daisuke Ito, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/492,923

(22) Filed: Jan. 28, 2000

(30) Foreign Application Priority Data

May 28, 1998 (JP) .................................................. 10-147189
May 28, 1999 (WO) .................................... PCT/JP99/02845

(51) Int. Cl.$^7$ .................................................. H01L 23/02
(52) U.S. Cl. ........................... 257/679; 257/678; 257/692
(58) Field of Search .................................... 257/679, 678, 257/692

(56) References Cited

U.S. PATENT DOCUMENTS

| | | | |
|---|---|---|---|
| 5,598,032 | * | 1/1997 | Fidalgo . |
| 5,705,852 | * | 1/1998 | Orihara et al. . |
| 5,710,458 | * | 1/1998 | Iwasaki . |
| 5,909,050 | * | 1/1999 | Furey et al. . |
| 5,986,341 | * | 11/1999 | Usami et al. . |
| 6,049,461 | * | 4/2000 | Haghiri-Tehrani et al. . |
| 6,081,025 | * | 6/2000 | Prancz . |

FOREIGN PATENT DOCUMENTS

| | | |
|---|---|---|
| 06310324 | 11/1994 | (JP) . |
| 8-207476 | 8/1996 | (JP) . |
| 08287208 | 11/1996 | (JP) . |
| 11-011055 | 1/1999 | (JP) . |

\* cited by examiner

*Primary Examiner*—Sheila V. Clark
(74) *Attorney, Agent, or Firm*—Pennie & Edmonds LLP

(57) ABSTRACT

Thickness of an IC card is decreased, and the manufacturing efficiency of the IC card is enhanced so as to reduce the manufacturing cost. The IC card comprises: a semiconductor element 14 having electrodes; a plane coil 12 formed in such a manner that a conductor 12b is wound on the same face, having terminals 12a at respective ends; bonding wires 16 for electrically connecting terminals at both ends of the plane coil to the electrodes of the semiconductor element; and resin films 10 for sealing the semiconductor element, plane coil and bonding wires 16 when they are interposed between the resin films, wherein the thickness of the semiconductor element 14 is smaller than the thickness of the plane coil 12 and does not interfere with the conductor of the plane coil, and a thin wall thickness portion 12c is formed on a front face of the conductor of the plane coil through which the bonding wires can pass without protruding from the region of the thickness of the plane coil.

13 Claims, 6 Drawing Sheets

IC CARD AND PLANE COIL FOR IC CARD

FIELD OF THE INVENTION

The present invention relates to an IC card, more particularly to a non-contact type IC card, and a plane coil used for such an IC card.

The non-contact type IC card includes: a plane coil in which a conductor is wound around a sheet-shaped card material a plurality of times; and a semiconductor electrically connected to the plane coil. The plane coil functions as an antenna by which information can be transmitted between a card processor and the IC card. When the plane coil is disposed between the card processor and the IC card, it is possible to transmit information between the card processor and a semiconductor element provided on the IC card in the non-contact condition.

DESCRIPTION OF THE BACKGROUND ART

Concerning the method of manufacturing a plane coil to be formed on an IC card, various methods are known. Examples of these methods are: a method in which a plane coil is formed in such a manner that a covered wire, which is covered with electrically insulating material, is wound so as to form the plane coil; a method in which a surface of a resin film is covered with a layer of metallic foil by means of sputtering, and then the layer of metallic foil is etched so as to form a plane coil; and a method in which a metallic sheet is subjected to punching so as to form a plane coil as disclosed in Japanese Unexamined Patent Publication No. 6-310324.

FIG. 11 is a view showing an example of the arrangement of an IC card in which the semiconductor element 102 is mounted on the plane coil 100. As shown in the drawing, the plane coil 100 is composed in such a manner that the conductor is wound on a face so that it cannot cross itself and the terminals 100a, 100b of the plane coil 100 are electrically connected with the electrodes of the semiconductor element 102. Concerning the method of connecting the semiconductor element 102 with the plane coil 100, the following methods can be provided. One of the methods is that the conductor of the plane coil 100 is put on the semiconductor element 102 as shown in FIG. 11 and the terminals 100a, 100b of the plane coil 100 are connected to the electrodes of the semiconductor element. The other method is that the terminals 100a, 100b of the plane coil 100 are drawn out to the inside or the outside of the plane coil, and the semiconductor element 102 is connected to the ends of the terminals 100a, 100b which have been drawn out.

However, as shown in FIG. 11, when the semiconductor element 102 is arranged in such a manner that it is put on the plane coil 100, the thickness of the IC card is increased to a value corresponding to a total of the thickness of the plane coil 100 and the thickness of the semiconductor element 102. Since the thickness is increased as described above, problems may be caused in the case where the thickness of the IC card must be restricted. Further, in order to connect the terminals 100a, 100b of the plane coil 100 to the electrodes of the semiconductor element 102 as they are, a distance between the electrodes of the semiconductor element 102 must be larger than the arrangement width of the plane coil 100. Accordingly, in the case of a semiconductor element 102, the size of which is smaller than the arrangement width of the plane coil 100, it is impossible to adopt such an arrangement as shown in FIG. 11.

In this connection, in some cases, a chip module is used instead of the semiconductor element 102, and the terminals 100a, 100b of the plane coil 100 are connected to the electrodes of the chip module. In this case, the same problem may occur.

On the other hand, in the case where the terminals 100a, 100b of the plane coil 100 are arranged inside or outside of the plane coil 100, it is necessary to bend end portions of the plane coil so that they can cross the plane coil 100. Accordingly, the manufacturing process of the plane coil 100 would become complicated.

SUMMARY OF THE INVENTION

The present invention has been achieved in order to solve the above problems. It is an object of the present invention to provide an IC card characterized in that: a semiconductor element of any size can be easily mounted on the IC card; the thickness of the IC card can be appropriately reduced; and the IC card can be easily manufactured. It is another object of the present invention to provide a plane coil appropriately applied to the above IC card.

The present invention provides an IC card comprising: a semiconductor element having electrodes; a plane coil, formed in such a manner that a conductor is wound on the same face, having terminals at respective ends; an electrical connecting means for electrically connecting terminals at respective ends of the plane coil to the electrodes of the semiconductor element; and resin films for sealing the semiconductor element, plane coil and connecting means when they are interposed between the resin films, wherein the thickness of the semiconductor element is smaller than the thickness of the plane coil, the semiconductor element is arranged in a plane region which is in a range of the thickness of the plane coil and does not interfere with the conductor of the plane coil, and a thin wall thickness portion is formed on a front face of the conductor of the plane coil through which the connecting means can pass without protruding beyond the thickness of the plane coil.

The conductor of the plane coil is formed by punching a metallic sheet, and a thin wall thickness portion is formed in a predetermined portion of the conductor of the plane coil.

The conductor of the plane coil is formed by etching a metallic sheet, and a thin wall thickness portion is formed in a predetermined portion of the conductor of the plane coil.

The connecting means is composed of bonding wires, and bonding connection is made by end portions of the bonding wires between terminals at both ends of the plane coil and the electrodes of the semiconductor element.

An outer circumferential surface of the bonding wire is covered with an electrically insulating covering material.

The connecting means is composed of a film carrier in which an electrical conductive pattern is formed on an insulating film, and the electrical conductive pattern is electrically connected with the terminals at the respective ends of the plane coil and the electrodes of the semiconductor element.

The semiconductor element is arranged between the conductors, which are adjacent to each other, of the plane coil in which the conductors are wound.

The plane coil is composed in such a manner that the conductors, which are adjacent to each other, are curved on the same plane, and a region in which the semiconductor element is arranged is specified between the conductors which are adjacent to each other.

The semiconductor element is arranged outside the outer circumferential edge portion of the plane coil in which the conductors are wound or inside the inner circumferential edge portion.

The present invention provides a plane coil, for an IC card comprising a conductor, at respective ends of which terminals electrically connected with the semiconductor element, via the electrical connecting means, are arranged, wound on the same plane, wherein a thin wall thickness portion is formed in a surface portion of the conductor through which the electrical connecting means can pass without protruding from a range of the thickness of the conductor.

A surface of the thin wall thickness portion is covered with an insulating layer having an electrically insulating property.

The plane coil has a space in which the conductors, which are adjacent to each other, are curved on the same plane, and the semiconductor element is arranged between the conductors which are adjacent to each other.

THE MOST PREFERRED EMBODIMENT FOR CARRYING OUT THE INVENTION

By referring to the appended drawings, the most preferred embodiment of the present invention will be explained as follows.

Figure 1:
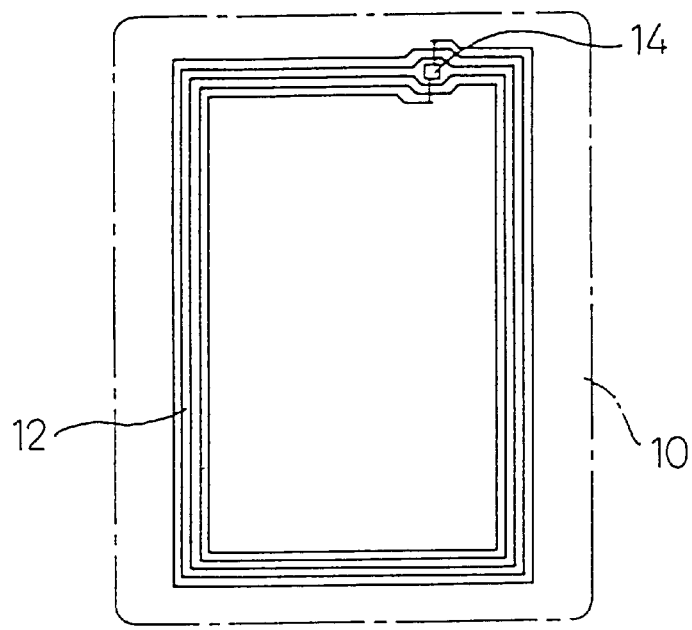
FIG. 1 is an arrangement view of the first embodiment of the IC card of the present invention.

FIG. 1 is a view showing the first embodiment of the present invention. The IC card of this embodiment is composed in such a manner that the plane coil 12, which composes an antenna, and the semiconductor element 14 are interposed between, and sealed by, two sheets of resin films 10, so that the overall IC card is formed into a card-shape.

The plane coil 12 is made by etching or punching a sheet of metal such as copper. The semiconductor element 14 and the plane coil 12 are electrically connected to each other by bonding wires 16 which connect electrode terminals of the semiconductor element 14 to terminals 12a of the plane coil 12.

Figure 2:
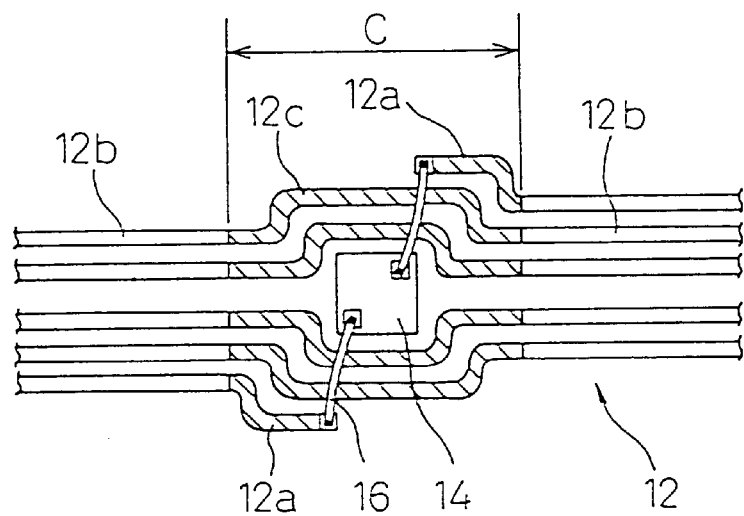
FIG. 2 is a plan view showing an arrangement of the connecting section between the semiconductor element and the plane coil.
Figure 3:
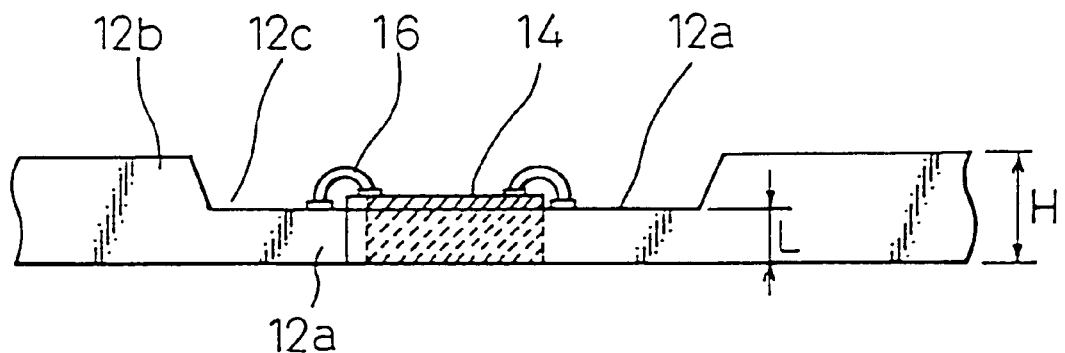
FIG. 3 is a side view showing an arrangement of the connecting section between the semiconductor element and the plane coil.

FIGS. 2 and 3 are respectively an enlarged plan view and an enlarged side view showing a connecting section in which the semiconductor element 14 and the terminals 12a of the plane coil 12 are connected to each other, wherein this connecting section is the most characteristic portion in the structure of the IC card of this embodiment. Reference numeral 12b is a conductor composing the plane coil 12. The plane coil 12 is formed into a configuration in which the conductor 12b is wound a plurality of times in the same manner as that of the conventional IC card shown FIG. 7.

A method of manufacturing the plane coil 12 by punching a metallic sheet is advantageous as follows. According to the above method, it is possible to form a narrow conductor 12b, that is, the width of the conductor 12b can easily be reduced. Therefore, it is possible to form a configuration in which the conductor 12b is wound a large number of times. The above plane coil 12 can easily be mass-produced when it is successively punched in a plurality of manufacturing stages. For the above reasons, as compared with the conventional method in which a covered wire is wound a plurality of times, it is possible to greatly reduce the manufacturing cost by adopting the above punching method. In this connection, of course, it is possible to form the plane coil by etching a metallic sheet. When a very narrow conductor is to be formed, the etching method is effective.

As shown in FIG. 2, this embodiment is characterized in that: the semiconductor element 14 is arranged in the coil width in which the conductor 12b of the plane coil 12 passes; and the conductor 12b is arranged outside the semiconductor element 14 so that the conductor 12b cannot overlap the semiconductor element 14. The reason why the above arrangement is adopted is that the terminals 12a, 12a on both sides of the plane coil 12 cannot be simultaneously connected to the electrodes of the semiconductor element 14 because the size of the semiconductor element 14 is too small. Another reason is that even if the conductor 12b is arranged to avoid overlapping the semiconductor element 14, the characteristic of the plane coil 12 is not effected, because the size of the semiconductor element 14 is small.

When the semiconductor element 14 and the conductor 12b of the plane coil 12 do not overlap each other as described in this embodiment, the overall thickness of the IC card is determined by the respective thickness of the plane coil 12 and the semiconductor element 14. Therefore, the arrangement of this embodiment is advantageous in that the thickness of the IC card can be reduced.

In this connection, the semiconductor element 14 is electrically connected to the terminals 12a of the plane coil 12 by bonding wires 16, the outer circumferential faces of which are covered with coating material having an electrically insulating property. The reason why the covered bonding wire 16 is used is described as follows. It is necessary to prevent the occurrence of an electrical short circuit would be caused if the bonding wires 16 came into contact with an intermediate portion between the electrodes of the semiconductor element 14 and the terminals 12a.

Figure 4A:
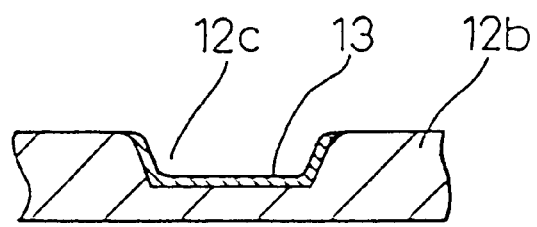
FIGS. 4(a) and 4(b) are cross-sectional views showing a state in which an insulating layer is provided on a surface of the thin wall thickness portion provided in the conductor.
Figure 4B:
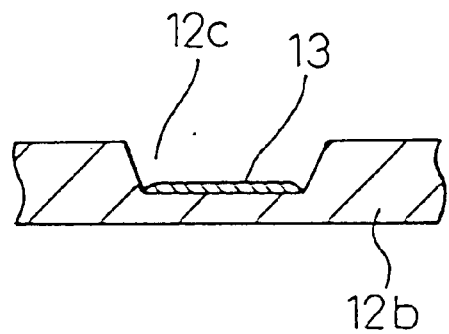

When there is no possibility of the occurrence of an electrical short circuit between the bonding wires 16 and the conductor 12b, of course, it is unnecessary to use the bonding wires 16 covered with an electrically insulating material. For example, when a method is adopted in which the insulating layer 13 is formed by making an electrical insulating film adhere onto a surface of the thin wall thickness portion 12c as shown in FIG. 4(a), or when a method is adopted in which the insulating layer 13 is formed by coating resin having a electrical insulating property on an inner bottom face of the thin wall thickness portion 12c as shown in FIG. 4(b), it is possible to conduct wire bonding by using bonding wires which are not covered with an electrically insulating material.

According to the wire bonding method in which the covered bonding wires 16 are used, bonding is carried out as follows. The bonding wire is pressed against a bonding face and given a frictional force by means of ultrasonic oscillation. Therefore, the covering material is separated from the bonding wire, and the thus exposed bonding wire is bonded to the bonding face. Therefore, in the case where wire bonding is conducted in such a manner that the bonding wires cross the conductor 12b as shown in this embodiment, the above method is preferably used.

In the wire bonding method, there is provided a method of bonding in which an arc formed by the bonding wire is not so high which is like the wedge bonding method. However, in order to draw out the bonding wire, the bonding wire protrudes upward so that it is a little higher than the bonding portion at which the bonding wire is drawn out. In this embodiment, in order to prevent the bonding wire 16 from protruding from the face of the conductor 12b, a portion of the conductor 12b, through which the bonding wire 16 passes in the case of bonding, is subjected to coining so as to reduce the thickness of the conductor 12b.

FIG. 3 is a view showing a state of the thin wall thickness portion 12c in which the conductor 12b has been subjected to coining. In FIG. 2, reference mark C represents a range in which the thin wall thickness portion 12c is formed. In FIG. 3, reference mark H represents a thickness of the conductor 12b, and reference mark L represents a thickness of the conductor 12b in a portion in which the thin wall thickness portion 12c is formed.

Since the thickness of a metallic sheet, which is formed into a pattern by punching, is approximately 100 $\mu$m and the thickness of the semiconductor element 14 is approximately 50 $\mu$m, the thickness L of the conductor 12b is reduced to about 50 $\mu$m by means of coining. Since the thin wall thickness portion 12c is formed as described above, it is possible to conduct bonding so that the bonding wire 16 can be accommodated in the thin wall thickness portion 12c. Therefore, the semiconductor element 14 and the bonding wire 16 can be accommodated in the thickness range of the plane coil 12.

As shown in FIG. 2, in this embodiment, the conductor 12b is subjected to coining, and a range in which the thin wall thickness portion 12c is formed is made wider than a range through which the bonding wires 16 pass, that is, the width of a range in which the thin wall thickness portion 12c is formed is made to be C. The reason is that coining must be conducted by one punching operation because the plane coil 12 is manufactured by punching. Of course, coining may be conducted only along the routes in which the bonding wires 16 pass.

Figure 5:
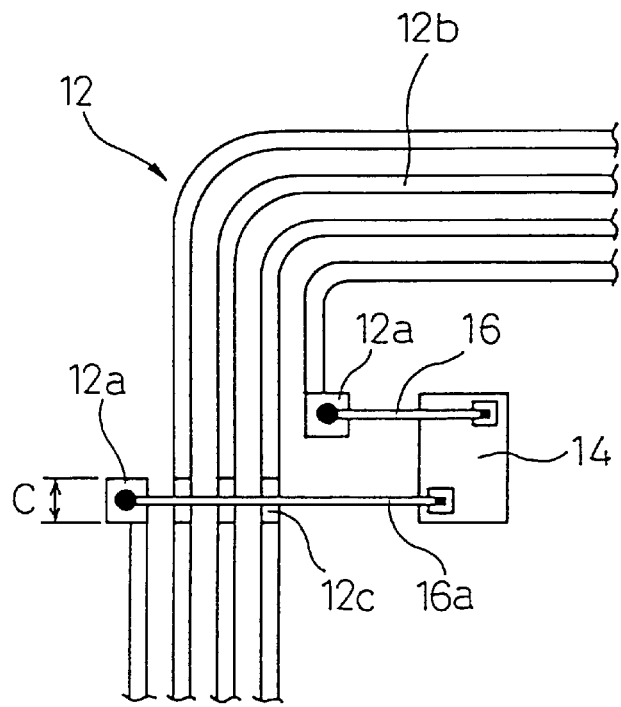
FIG. 5 is a plan view showing an arrangement of the connecting section in the second embodiment of the IC card.
Figure 6:
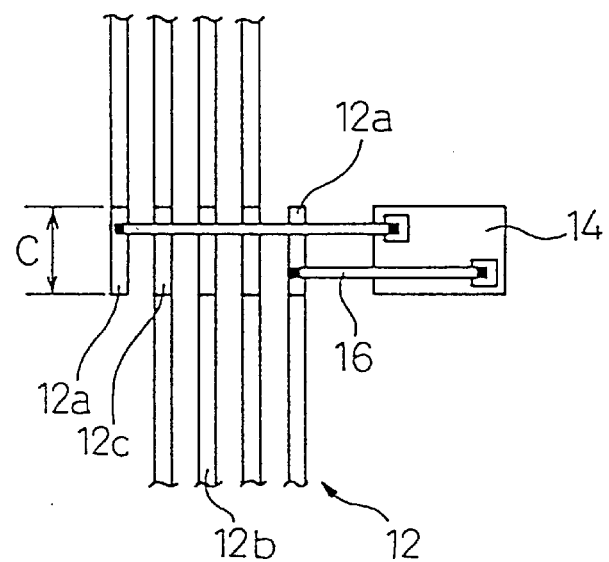
FIG. 6 is a plan view showing an arrangement of the connecting section in the third embodiment of the IC card.

FIGS. 5 and 6 are schematic illustrations showing the second and third embodiments of the IC card. In these embodiments, the semiconductor element 14 is arranged at a position which is separate from the width range in which the conductor 12b composing the plane coil 12 is arranged, that is, the semiconductor element 14 is arranged outside the outer circumferential edge portion of the plane coil 12 or inside the inner circumferential edge portion of the plane coil 12, and the terminals 12a of the plane coil 12 and the semiconductor element 14 are connected with each other by means of wire bonding in such a manner that the bonding wires cross the conductor 12b.

In the embodiment shown in FIG. 5, the terminals 12a on both sides of the conductor 12b are subjected to coining, so that the thickness of the terminals can be reduced. At the same time, a portion of the conductor 12b in which one of the bonding wires 16a crosses the conductor 12b is subjected to coining, so that the thin wall thickness portion 12c can be formed. Concerning the bonding wire 16a which crosses the conductor 12b and is connected with the terminal 12a, wire bonding is conducted in such a manner that the bonding wire 16a passes over the portion in which the thin wall thickness portion 12c is formed. Therefore, it is possible to accomplish the connection so that the bonding wire does not protrude from a surface of the conductor 12b.

In the embodiment shown in FIG. 6, the thin wall thickness portion 12c is formed in the conductor 12b in accordance with a portion in which the two bonding wires 16 for connecting the terminals 12a of the plane coil 12 with the semiconductor element 14, and the bonding wires 16 are arranged crossing the thin wall thickness portion 12c.

In this embodiment, the conductor 12b of the plane coil 12 and the semiconductor element 14 do not overlap each other. Therefore, it is possible to reduce the overall thickness of the IC card. Accordingly, when the thin wall thickness portion 12c is formed in a portion in which the bonding wires pass, the bonding wires can be accommodated in the thickness of the plane coil 12.

As described above, in the IC card of the present invention, the plane coil 12 and the semiconductor element 14 are arranged so that they do not overlap each other, and further the thin wall thickness portion 12c is formed in a portion of the conductor 12b in which the bonding wires 16 for connecting the terminals 12a of the plane coil 12 with the electrodes of the semiconductor element 14 pass, so that the bonding wires 16 do not protrude from a surface of the conductor 12b. Due to the above structure, the overall thickness of the IC card can be reduced.

When the plane coil 12 and the semiconductor element 14 are connected to each other by means of wire bonding, it becomes possible to electrically connect the plane coil 12 with the semiconductor element 14 irrespective of the size and the arrangement position of the semiconductor element 14. When the terminals 12a of the plane coil 12 and the semiconductor element 14 are connected with each other by means of wire bonding, the semiconductor element 14 is hung by the bonding wires 16. Therefore, under the condition that the semiconductor element 14 is wire-bonded, it can be easily conveyed together with the plane coil 12.

Instead of the bonding wires, metallic ribbons may be used for connecting the semiconductor element 14 with the terminals 12a of the plane coil 12. Compared with the bonding wires, the metallic ribbons are advantageous in that the electrical resistance is low.

Figure 7A:
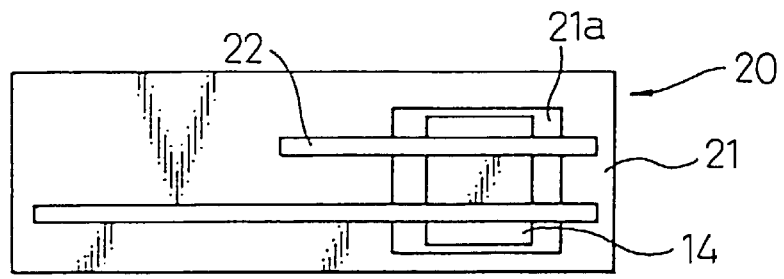
FIGS. 7(a) and 7(b) are plan and side views showing an arrangement of the connecting section composed of a tape carrier.
Figure 7B:
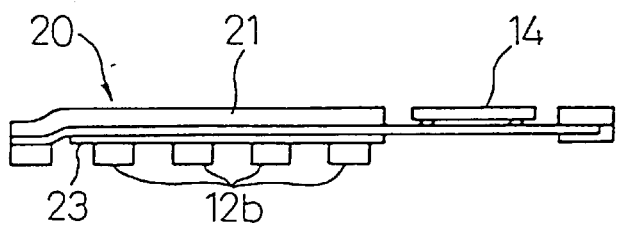

FIGS. 7(a) and 7(b) are respectively a plan view and a side view showing an embodiment of the connecting section in the case where a tape carrier (TAB tape) is used as the electrically connecting means instead of bonding wires.

In this embodiment, the tape carrier 20 is composed in such a manner that two substantially parallel conductor patterns 22 are formed on an insulating resin film 21. At a position of the semiconductor element 14, an opening 21a, the size of which is larger than the plane size of the semiconductor element 14, is formed on the resin film 21, and the two conductor patterns 22 are arranged above the opening 21a.

On one side, end portions of the two conductor patterns 22 extend to the same portion, and the two conductor patterns 22 are electrically connected to the electrodes of the semiconductor element at the position of the opening 21a. On the other side, an end portion of one of the conductor patterns 22 is short, and an end portion of the other conductor pattern 22 is long. These end portions are respectively connected to the outside and the inside terminal of the plane coil 12 in the case where the semiconductor element 14 is arranged inside the plane coil 12.

In this embodiment, the semiconductor element 14 is connected to the conductor pattern 22 so that the semiconductor element 14 can be located on the same side as that of the resin film 21 with respect to the conductor pattern 22. Accordingly, this embodiment is preferably applied to a case in which the thickness of the semiconductor element 14 is small. In this connection, reference numeral 23 is a layer of an insulating resist which is used to insulating the conductor 12b of the plane coil 12.

Figure 8A:
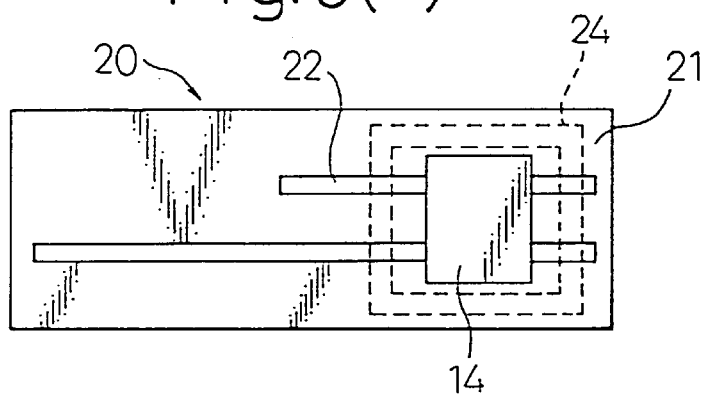
FIGS. 8(a) and 8(b) are plan and side views showing another arrangement of the connecting section composed of a tape carrier.
Figure 8B:
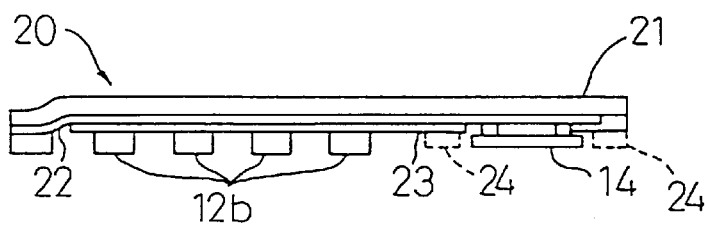

FIGS. 8(a) and 8(b) are respectively a plan view and a side view showing another embodiment of the connecting section in the case where a tape carrier is used. A different point of this embodiment from the embodiment described above is that the semiconductor element 14 is connected to the conductor pattern so that the semiconductor element 14 can be located on the opposite side to the resin film 21 with respect to the conductor pattern. Accordingly, there is provided no opening 21a unlike the embodiment described before. In this embodiment, the semiconductor element 14 is located on the side of the plane coil 12. Therefore, even if the thin wall thickness portion is not provided in the conductor 12b of the plane coil 12, there is a possibility that the semiconductor element 14 is sufficiently accommodated in thickness range c of the conductor 12b of the plane coil.

In this connection, when the semiconductor element 14 cannot be firmly held, a reinforcement member 24 may be arranged in the periphery of the semiconductor element 14.

Figure 9:
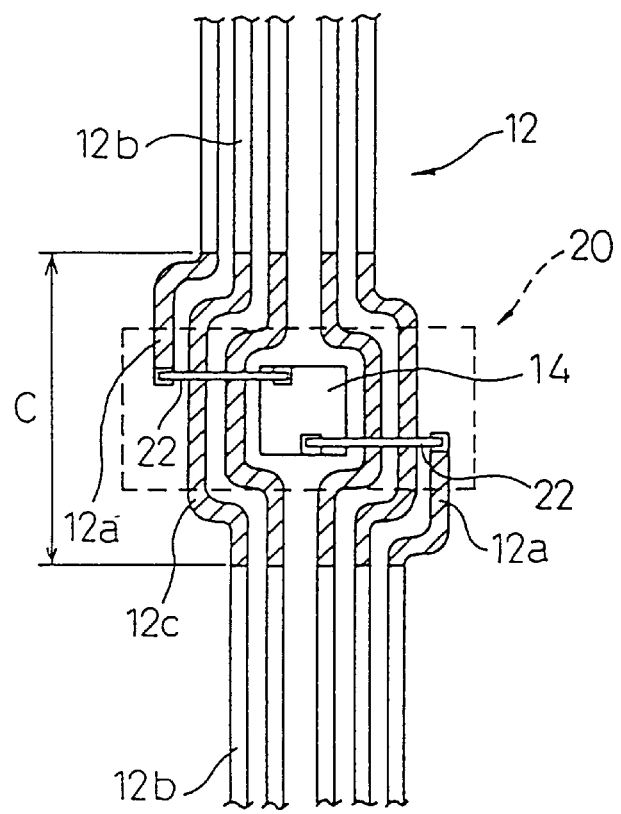
FIG. 9 is a plan view showing an IC card in which a tape carrier is used.
Figure 10:
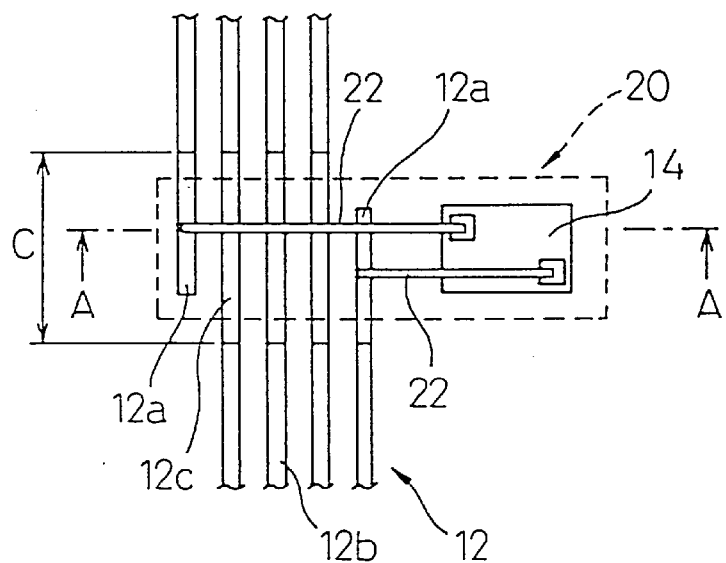
FIG. 10 is a plan view showing an IC card of another embodiment in which a tape carrier is used.
Figure 11:
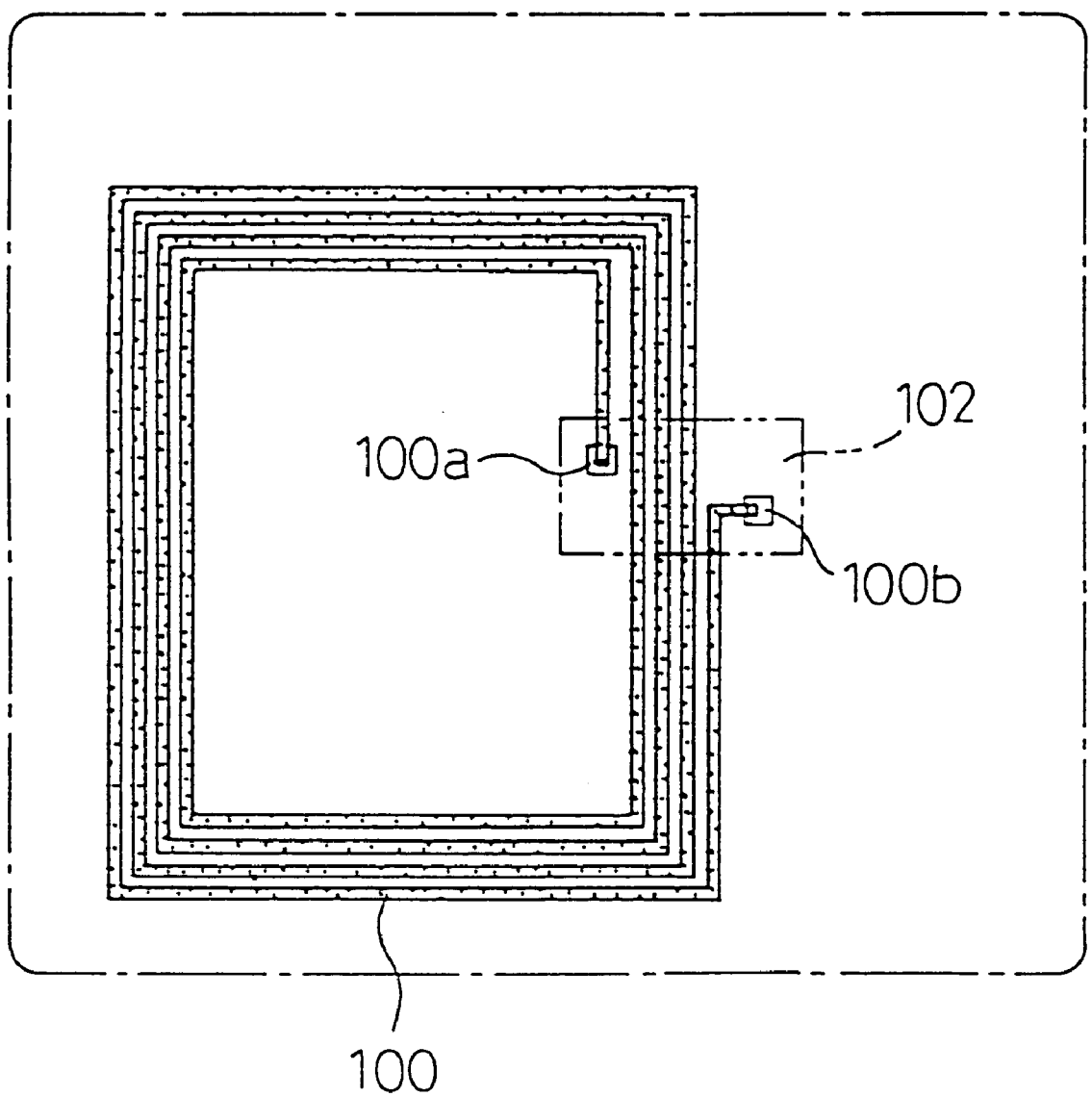
FIG. 11 is a schematic illustration showing an arrangement of the conventional IC card.

FIGS. 9 and 10 are views showing embodiments of the connecting section in the case where a tape carrier is used as the electrical connecting means instead of bonding wires. In these embodiment, the position of the semiconductor element shown in FIG. 9 corresponds to the position of the semiconductor element shown in FIG. 2, and the position of the semiconductor element shown in FIG. 10 corresponds to the position of the semiconductor element shown in FIG. 6. Concerning the arrangement of connection for connecting the tape carrier 20 with the semiconductor element 14, any of the arrangements shown in FIGS. 7(a) and 7(b) and the arrangements shown in FIGS. 8(a) and 8(b) may be adopted.

In this connection, the IC card of each embodiment of the present invention described above uses the plane coil 12 formed by press forming a metallic sheet. When coining is conducted simultaneously when the metallic sheet is punched so as to form the conductor 12b, the thin wall thickness portion 12c can be easily formed in the conductor 12b. The above method is advantageous in that coining and punching can be carried out in the same manufacturing line.

INDUSTRIAL APPLICABILITY

According to the IC card of the present invention which is composed as described above, it is possible to electrically connect the plane coil to the semiconductor element irrespective of the width of the plane coil and the size of the semiconductor element. Since the thin wall thickness portion is provided in accordance with a portion of the conductor in which the bonding wires cross the conductor, the thickness of the connecting portion, in which the plane coil is connected with the semiconductor element, can be reduced to the substantially same thickness as that of the plane coil. Therefore, the thickness of the IC card can be appropriately reduced. When a metallic thin sheet is punched so as to manufacture a plane coil, the productivity of the plane coil can be enhanced and the manufacturing cost can be effectively decreased.

What is claimed is:

1. An IC card comprising:

a semiconductor element having electrodes;

a plane coil formed in such a manner that a conductor is wound on the same face, having terminals at respective ends;

an electrical connecting means for electrically connecting terminals at the respective ends of the plane coil to the electrodes of the semiconductor element; and resin films for sealing the semiconductor element, plane coil and connecting means when they are interposed between the resin films, wherein the thickness of the semiconductor element is smaller than the thickness of the plane coil, the semiconductor element is arranged in a plane region which is in a range of the thickness of the plane coil and does not interfere with the conductor of the plane coil, and a thin wall thickness portion is formed on a front face of the conductor of the plane coil through which the connecting means can pass without protruding from the region of the thickness of the plane coil.

2. An IC card according to claim 1, wherein the conductor of the plane coil is formed by punching a metallic sheet, and a thin wall thickness portion is formed in a predetermined portion of the conductor of the plane coil.

3. An IC card according to claim 1, wherein the conductor of the plane coil is formed by etching a metallic sheet, and a thin wall thickness portion is formed in a predetermined portion of the conductor of the plane coil.

4. An IC card according to claim 1, wherein the connecting means is composed of bonding wires, and bonding connection is made by end portions of the bonding wires between terminals at the respective ends of the plane coil and the electrodes of the semiconductor element.

5. An IC card according to claim 4, wherein an outer circumferential surface of the bonding wire is covered with an electrically insulating covering material.

6. An IC card according to claim 1, wherein the connecting means is composed of a film carrier in which an electrical conductive pattern is formed on an insulating film, and the electrical conductive pattern is electrically connected with the terminals at the respective ends of the plane coil and the electrodes of the semiconductor element.

7. An IC card according to claim 1, wherein the semiconductor element is arranged between the conductors, which are adjacent to each other, of the plane coil in which the conductors are wound.

8. An IC card according to claim 7, wherein the plane coil is composed in such a manner that the conductors, which are adjacent to each other, are curved on the same plane, and a region in which the semiconductor element is arranged is specified between the conductors which are adjacent to each other.

9. An IC card according to claim 1, wherein the semiconductor element is arranged outside the outer circumferential edge portion of the plane coil in which the conductors are wound or inside the inner circumferential edge portion.

10. An IC card according to claim 1, wherein an insulating layer is formed on a surface of the thin wall thickness portion.

11. A plane coil for an IC card comprising a conductor, at respective ends of which terminals electrically connected with the semiconductor element via the electrical connecting means are arranged, wound on the same plane, wherein a thin wall thickness portion is formed in a surface portion of the conductor through which the electrical connecting means can pass without protruding from a range of the thickness of the conductor.

12. A plane coil for an IC card according to claim 11, wherein a surface of the thin wall thickness portion is covered with an insulating layer having an electrical insulating property.

13. A plane coil for an IC card according to claim 11, wherein the plane coil has a space in which the conductors, which are adjacent to each other, are curved on the same plane, and the semiconductor element is arranged between the conductors which are adjacent to each other.

* * * * *